United States Patent
Liu (10) Patent No.: US 7,125,791 B2
(45) Date of Patent: Oct. 24, 2006

(54) ADVANCED COPPER DAMASCENE STRUCTURE

(75) Inventor: Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 122 days.

(21) Appl. No.: 10/963,268

(22) Filed: Oct. 12, 2004

(65) Prior Publication Data

US 2006/0076682 A1   Apr. 13, 2006

(51) Int. Cl.
*H01L 21/4763* (2006.01)

(52) U.S. Cl. .................. 438/622; 438/701; 438/740; 257/758

(58) Field of Classification Search ............. 438/622
See application file for complete search history.

(56) References Cited

U.S. PATENT DOCUMENTS

| | | | |
|---|---|---|---|
| 5,746,884 A * | 5/1998 | Gupta et al. ............. 438/640 |
| 5,939,335 A | 8/1999 | Arndt et al. | |
| 6,235,643 B1 * | 5/2001 | Mui et al. ............... 438/719 |
| 6,274,483 B1 | 8/2001 | Chang et al. | |
| 6,294,476 B1 * | 9/2001 | Lin et al. ............... 438/725 |
| 6,586,842 B1 | 7/2003 | You et al. | |
| 6,689,684 B1 * | 2/2004 | You et al. ............... 438/639 |
| 2003/0227089 A1 * | 12/2003 | Watanabe et al. ....... 257/758 |
| 2005/0073053 A1 * | 4/2005 | Park ....................... 257/774 |

OTHER PUBLICATIONS

Wang, X., et al., "In-Situ Shallow Trench Isolation Etch with Clean Chemistry," IEEE/CPMT Int'l Electronics Manufacturing Technology Symposium, 1998, pp. 150-154.

* cited by examiner

*Primary Examiner*—Anh D. Mai
*Assistant Examiner*—Abul Kalam
(74) *Attorney, Agent, or Firm*—Slater & Matsil, L.L.P.

(57) ABSTRACT

A method of forming round bottom corners for conductive lines in an integrated circuit is presented. Two approaches are taken to achieve a preferred rounding profile. For both approaches, a trench is formed and conductive materials are filled in the trench. The etch stop layer (ESL) approach involves forming an ESL underlying an inter-level dielectric (ILD). After etching a trench in the ILD, the ESL is etched to further round trench corners. The chemistry approach involves changing the etching chemistry when etching the trench. The two approaches can be used separately or combined in the preferred embodiments of the present invention. In a preferred embodiment, a via structure comprising two copper lines and an interconnecting via is formed. By using the ESL and chemistry approaches, the bottom corners are formed substantially round. The preferred embodiment of the present invention is applied to conductive features that are close enough to cause time dependent dielectric breakdown.

12 Claims, 6 Drawing Sheets

ADVANCED COPPER DAMASCENE STRUCTURE

TECHNICAL FIELD

This invention relates generally to integrated circuit fabrication, and more specifically to metallization.

BACKGROUND

A conventional integrated circuit contains a plurality of patterns of metal lines separated by inter-wiring spacings, and a plurality of interconnect lines, such as bus lines, bit lines, word lines and logic interconnect lines. Typically, the metal patterns of vertically spaced metallization layers are electrically interconnected by vias. Metal lines formed in trench-like openings typically extend substantially parallel to the semiconductor substrate. Semiconductor devices of such type according to current technology may comprise five or more levels of metallization to satisfy device geometry and micro miniaturization requirements.

A common method for forming metal lines or plugs is known as "damascene". Generally, this process involves forming an opening (or via) in the dielectric interlayer, which separates the vertically spaced metallization layers. A via is typically formed using conventional lithographic and etching techniques. After a via is formed, the via is filled with copper or copper alloys. Excess metal material on the surface of the dielectric interlayer is then typically removed by chemical mechanical planarization (CMP).

An electrical field exists between two metal lines when there is a voltage potential difference. A high electrical field causes mechanisms such as electro-migration. With time, an extrusion may eventually be formed in the dielectric separating the two metal lines and shorting the metal lines, hence a time dependent dielectric breakdown (TDDB) occurs. The magnitude of the electrical field between metal lines is one of the determining factors of TDDB, and the higher the electrical field is, the more likely a TDDB will occur.

Figure 1:
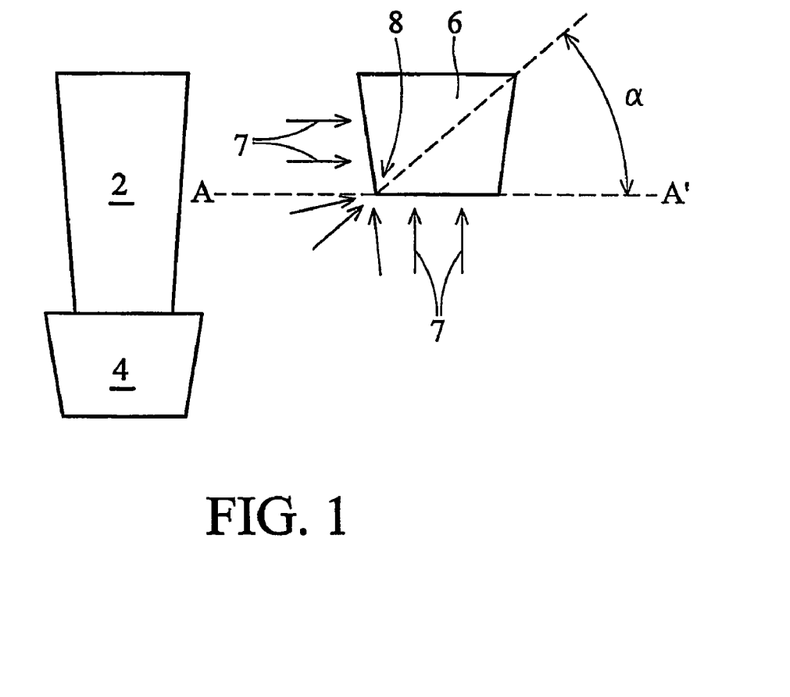
FIG. 1 illustrates an electrical field distribution between a metal line and a neighboring via connecting to a metal line.
Figure 2:
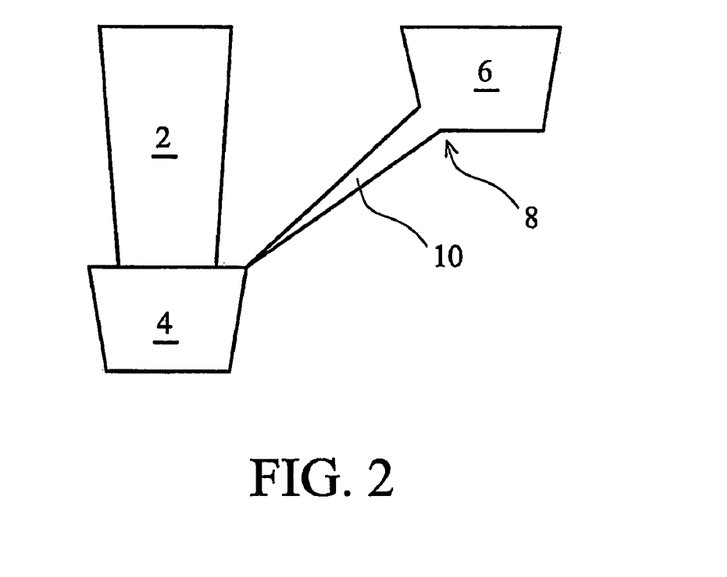
FIG. 2 illustrates an extrusion formed between a metal line and a neighboring via connecting to a metal line.

Vias and their neighboring features are typically subject to TDDB. FIG. 1 illustrates an example. Via 2 is connected to a metal line 4, and both are coupled to a high voltage. Metal line 6 is a ground line at 0V. An electrical field distribution is symbolized by arrows 7. The electrical field next to corner 8 is the strongest since corner 8 is typically substantially sharp. FIG. 2 illustrates an extrusion 10 formed due to the strong electrical field shown in FIG. 1. Typically, for a metal line having a substantially rectangular shaped cross section, the extrusion 10 has an angle α close to 45° with respect to a horizontal line A–A'. The extrusion 10 comprising metal material migrated from metal line 6 is formed starting from metal line 6 and extending toward where the electrical field is strongest. With time, the extrusion extends to via 2 or metal line 4. When it touches via 2 or metal line 4, the metal lines are shorted and the circuit fails.

The TDDB problem is more severe for copper vias and copper lines. Copper tends to migrate more readily than other commonly used metals such as tungsten. Copper features are typically used for 0.13 μm and below, therefore are more closely spaced and the electrical fields between copper features are stronger. Also, copper is typically used with low-k inter-metal dielectrics (ILD) that have low material density and porous structures. Therefore, the copper features with low-k materials are more prone to suffer from the time dependent dielectric breakdown problem.

Another problem caused by sharp corners is stress. The sharp corner 8 tends to cause high stresses in the surrounding dielectrics and cause cracks in the passivation layer.

In order to make the electrical field less concentrated at corners and stress reduced, the corners need to be rounded. Typically, when a trench is formed, the corners at the bottom always have a certain degree of curvature. However, the radius of curvature of the naturally formed round corners is not adequate for reducing electrical concentration and stress. Besides, forming round corners using existing processes may introduce other problems. For example, it is observed that narrow-width metal lines typically have higher curvature than wide metal lines formed under the same conditions. Therefore, narrow metal lines are formed where TDDB is likely to occur. However, due to the micro-loading effect, narrow metal lines are thinner than wide metal lines so that they have higher sheet resistance. Therefore, it is not practical to form round corners by reducing the width of the metal lines.

SUMMARY OF THE INVENTION

The preferred embodiment of the present invention presents a method of forming round bottom corners for conductive lines in the integrated circuit.

Two approaches can be taken to form conductive lines having substantially round bottom corners. In both approaches, a trench is formed and conductive materials are filled in the trench. The etch stop layer (ESL) approach involves forming an ESL underlying an inter-level dielectric (ILD). After etching a trench in the ILD, the ESL is further etched. Etching the ESL generates a polymer that is left at corner and thus rounds trench corners. The chemistry approach involves changing etching chemistry when etching a trench so that the bottom corners of the trench are rounded. These two approaches can be used separately or combined in preferred embodiments of the present invention.

In accordance with one aspect of the present invention, a via structure comprising two copper lines and an interconnecting via is formed. An ILD and a first ESL are formed over a substrate. A first trench is formed in the first ILD and the first ESL. Etching the first ESL generates a polymer that protects the bottom corners and thus causes round bottom corners. The first trench is filled with copper or copper alloys to form a first copper line. A via etch stop layer (ESL), a via ILD, a trench ESL, and a trench ILD are then formed. A via opening and a trench opening are formed. The exposed trench ESL in the trench opening is then etched to form substantially round bottom corners in the trench opening. The via opening and trench opening are filled with copper or copper alloys. When etching trenches for copper lines, the etching chemistry is adjusted to further round the corners. With round bottom corners having a higher radius of curvature, the electrical field is less concentrated and the stress to the surrounding dielectrics is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 3:
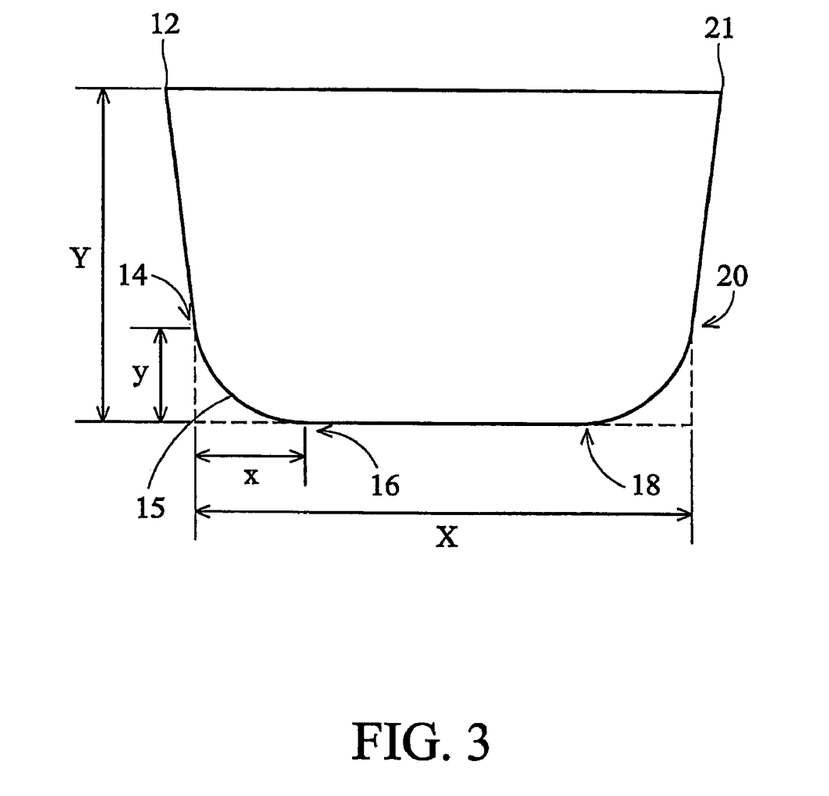
FIG. 3 illustrates a metal line having substantially round bottom corners and an illustrative view of a rounding profile.

The preferred embodiment of the present invention presents a method of rounding the bottom corners of conductive lines. FIG. 3 illustrates a cross sectional view of a metal line having a rounding profile. A sidewall between points 12 and 14 is substantially straight, although it may be a little slanted due to etching effects. The region between points 14 and 16 is a round corner region 15. A bottom line between points 16 and 18 is substantially straight. A rounding profile can be measured by comparing the length x of round region 15 and the total length X of the bottom. The roundness reaches maximum value when x equals X/2. The smaller x is compared to X, the less rounded the corner is. The roundness of the bottom corner 15 can also be measured by comparing its height y with the total height Y of the metal line. It is understood that a round corner may have a substantially non-uniform radius of curvature. Throughout the description, the roundness of a corner represents an average radius of curvature of the corner.

A corner is defined as substantially round if it has a rounding profile that can be approximately defined as:

$$X/3 >= x >= X/5 \quad \text{[Eq. 1]}$$

$$\text{and } y >= Y/4 \quad \text{[Eq. 2]}$$

more preferably, $$X/3 >= x >= X/4 \quad \text{[Eq. 3]}$$

By using the preferred embodiment of the present invention, round bottom corners having the rounding profile defined in Equations 1 through 3 can be formed.

Two approaches can be taken to achieve the preferred rounding profile. In both approaches, a trench is formed and conductive materials are filled in the trench. The etch stop layer (ESL) approach involves forming an ESL underlying an inter-level dielectric (ILD). After etching a trench in the ILD, the ESL is further etched to round the trench corners. The chemistry approach involves changing the etching chemistry when etching the trench so that the bottom corners of the trench are round. These two approaches can be used separately or combined in the preferred embodiments of the present invention. The details of the two approaches are discussed in detail in subsequent paragraphs.

FIGS. 4 through 10 are cross-sectional views of intermediate stages in the making of a preferred embodiment of the present invention. A via connecting two copper lines is formed. Both copper lines are subject to time dependent dielectric breakdown. The preferred embodiment presents how round bottom corners can be formed for both copper lines. It is appreciated that the formation of the lower layer metal line can be used in formation of any other conductive line as well. Although the preferred embodiment uses copper as the conductive material, alternative conductive materials such as doped semiconductor, metal or metal alloys can also be used in other embodiments. Conductive lines and copper lines are used interchangeably throughout the description.

Figure 4:
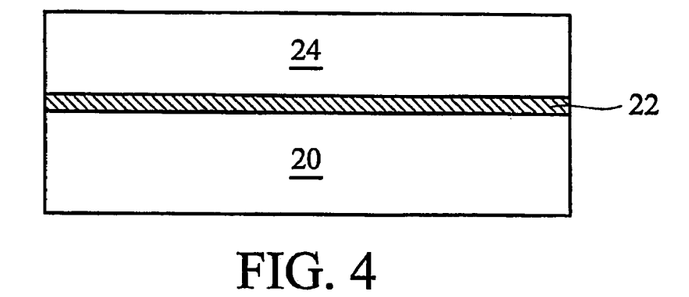
FIGS. 4 through 10 are cross-sectional views of intermediate stages in the making of a preferred embodiment of the present invention.
Figure 5:
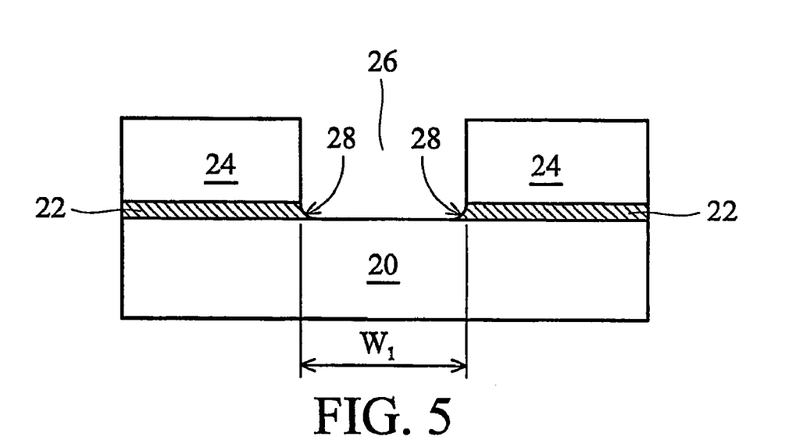
Figure 6:
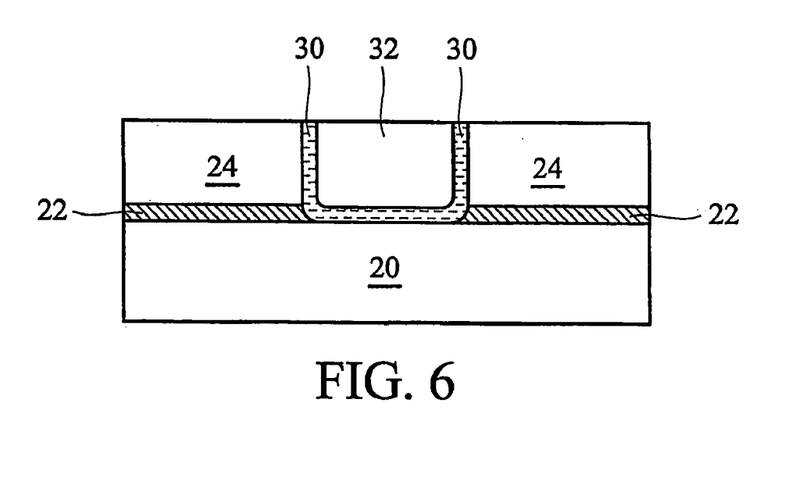

FIGS. 4 through 6 illustrate formation of a bottom-layer conductive line. FIG. 4 shows the formation of an ESL 22 and an ILD 24. In a preferred embodiment taking the ESL approach, an etch stop layer (ESL) 22 is formed on a base material 20. Base material 20 can be any non-conductive material. ESL 22 serves two purposes. First, it reduces the micro-loading effect and provides a more uniformed trench depth across a chip. Second, etching ESL 22 generates a polymer that helps the rounding of the trench corners. Preferably, the ESL 22 comprises SiC, $SiO_2$, or other carbon, and oxygen containing materials. The preferred thickness of ESL 22 is between about 200 Å and about 2000 Å, and more preferably about 400 Å. ESL 22 has a preferred k value of between about 3 and about 8. In other embodiments, when only the chemistry approach is taken, no ESL 22 is formed.

An ILD layer 24 is formed on the ESL 22. The ILD layer 24 preferably comprises a material having a dielectric constant (K value) lower than about 3.3 and contains nitrogen, carbon, hydrogen, oxygen, fluorine and their combinations. ILD 24 is preferably formed by, e.g., chemical vapor deposition (CVD), spin-on, atomic layer deposition (ALD), plasma enhanced CVD (PECVD), or other well-known deposition techniques. The thickness of ILD 24 defines the thickness of the conductive lines formed therefore is desired to be smaller than about 0.3 μm.

FIG. 5 illustrates a trench 26 formed by anisotropically etching ILD 24. Etching stops at ESL 22. In the preferred embodiment, the width $W_1$ of the trench 26 is smaller than 0.15 μm. Corners 28 of the trench 26 can be rounded by using the chemistry approach. Etching gases such as $CF_4$, $CHF_3$, Ar, and $O_2$ are preferred when etching ILD 24. In the preferred embodiment, the etching chemical contains oxygen in the range preferably between about 1% and about 10%, and more preferably about 5%. The preferred carbon content is in the range preferably between about 1% and about 10%, and more preferably about 5%. The preferred hydrogen content is between about 1% and about 10%, and more preferably about 5%. In an exemplary embodiment, by using an etching chemical containing 5% oxygen, 5% hydrogen, and 5% carbon, substantially round corners are formed. The resulting round corners have a rounding profile with width x about ¼ of the width X of the conductive line, and the round region height y of about ¼ of the height Y of the conductive line.

The ESL 22 is then etched. A polymer is generated by etching ESL 22. Typically, the polymer is taken away during the etching process. However, there is still polymer left on the sidewalls and the bottom of the trench 26, especially at the bottom corners 28. Therefore, there is less etching to the corners 28 than other places in the trench due to the protection of the polymer.

FIG. 6 illustrates a diffusion barrier layer 30 and a conductive line 32 formed in trench 26. Barrier 30 is preferably formed of a material comprising titanium, titanium nitride, tantalum, tantalum nitride, or other alternatives. The material of the conductive line 32 is preferably copper or copper alloys. Conductive line 32 will be referred to as copper 32. Copper 32 is typically formed by depositing a thin layer of seed copper or copper alloy, then plating to fill the trench 26. A chemical mechanical planarization (CMP) is then performed to polish the copper to the surface of the trench 26.

Figure 7:
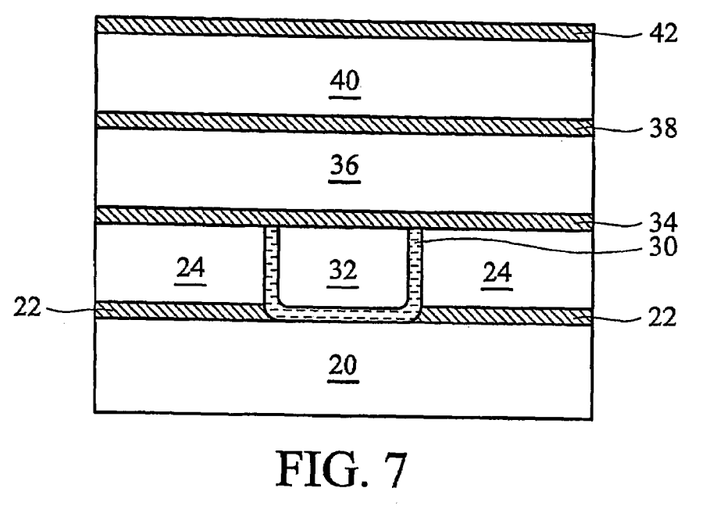

A dual damascene process is preferably performed to form a via and an upper-layer copper line. FIG. 7 shows a via etching stop layer (ESL) 34 formed on copper line 32. Via ESL 34 is preferably a dielectric comprising carbon, hydrogen, and oxygen. A via ILD layer 36 is formed on the via ESL layer 34 providing insulation between copper line 32 and an upper-layer copper line that will be formed subsequently. A trench etch stop layer (ESL) 38, a trench ILD 40 and a hard mask 42 are formed, as shown in FIG. 7. The trench ESL 38 is preferably formed by similar methods and using similar materials as for ESL 22. The materials and methods of forming via ILD 36 and trench ILD 40 are known in the art. The thickness of the second ILD 40 defines the thickness of the top metal line and is preferably smaller than about 0.3 µm.

Figure 8:
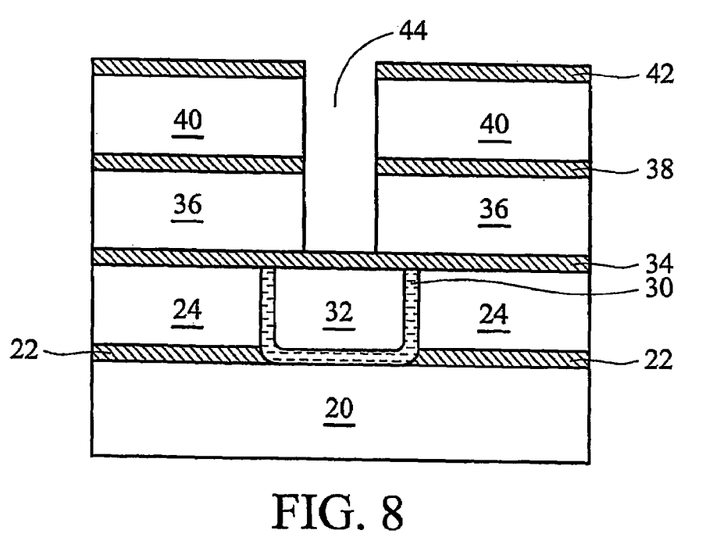

FIG. 8 illustrates formation of a via opening 44. A photo resist material (not shown) is formed and patterned over the surface hard mask 42. An anisotropic etch, preferably using fluorine containing etching gas, cuts through the surface hard mask 42 and etches down through the trench ILD 40, trench ESL 38, via ILD 36 and stops at the via ESL 34, therefore forming a via opening 44. The via ESL 34 protects the underlying lower-layer copper line 32 from being etched.

Figure 9:
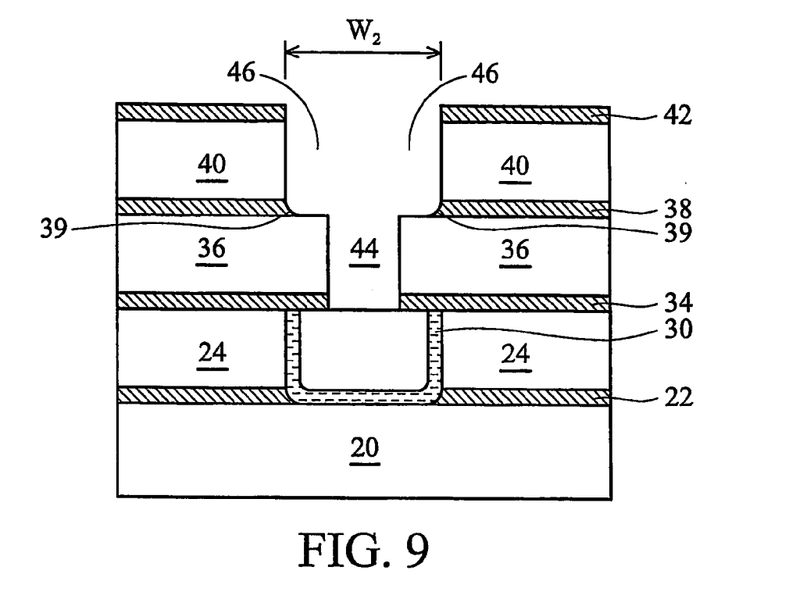

FIG. 9 illustrates the formation of a trench opening 46. An anisotropic etch cuts through the surface hard mask 42 and down through the trench ILD 40, stopping at the trench ESL 38 and thus forming the trench opening 46. Trench opening 46 will be used to form an upper-layer copper line when filled and it has a preferred width $W_2$ of smaller than about 0.15 µm.

In the preferred embodiment using the ESL approach, trench etch stop layer 38 is then etched from the trench opening 46. As has been discussed previously, etching trench ESL 38 generates a polymer that protect the corners 39, therefore, corners 39 will be substantially round. In other embodiments, the chemistry approach is preferably used for etching trench ILD 40. In a more preferred embodiment, the ESL and chemistry approaches are combined. The exposed portion of via ESL 34 is etched. Because via ESL 34 is quite thin relative to ILD layers 36 and 40, process control and end-point detection are much more closely controlled, thus limiting the likelihood of over-etching through the underlying lower-layer copper line 32.

Figure 10:
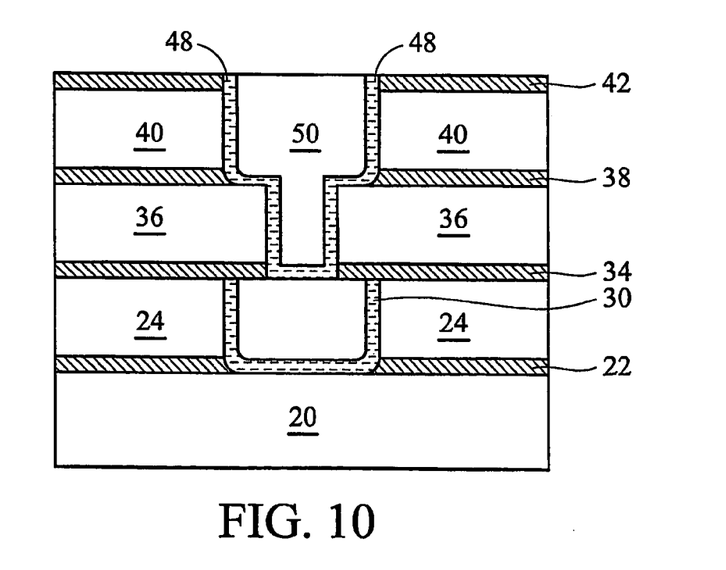

FIG. 10 illustrates formation of a barrier layer 48 and a conductive line 50 in openings 44 and 46. Barrier layer 46 is preferably formed of a material comprising titanium, titanium nitride, tantalum, tantalum nitride, and other layers as well. The barrier layer 46 prevents via materials from diffusing into ILDs 36 and 40. The thickness of the barrier layer 48 is preferably between about 20 Å and about 300 Å, and more preferably about 100 Å. The remaining space of the via opening 44 and trench opening 46 are filled with conductive materials, preferably copper or copper alloys. A CMP is performed to level the surface.

Figure 11:
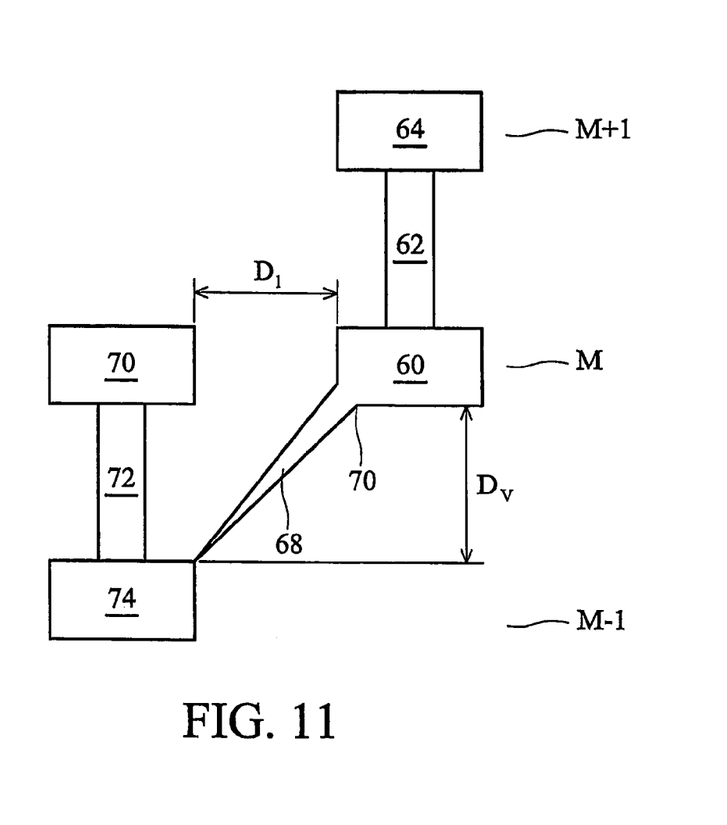
FIG. 11 illustrates an application of the preferred embodiment of the present invention, where two via structures are in different metal layers.

Conductive lines having substantially round bottom corners are formed by the preferred embodiment of the present invention. The round bottom corners make an extrusion less likely to be formed due to the close proximity between a conductive line and its neighboring features. FIG. 11 illustrates an application of the preferred embodiment of the present invention. A first via structure comprises a copper line 70 in layer M, a via 72 and a copper line 74 in layer (M−1). A second via structure comprises a copper line 60 in layer M, a via 62 and a copper line 64 in layer (M+1). An extrusion 68 may be formed at corner 70 of copper line 60, causing time dependent dielectric breakdown. Extrusion 68 may be formed between copper line 60 and copper line 74 or between copper line 60 and via 72, depending on the electrical field distribution. When the horizontal distance $D_1$ is smaller than about 0.15 µm and/or the vertical distance $D_v$ is smaller than about 0.3 µm, a substantially round bottom corner 70 having a round profile defined in Equations 1 through 3 is preferred.

Figure 12:
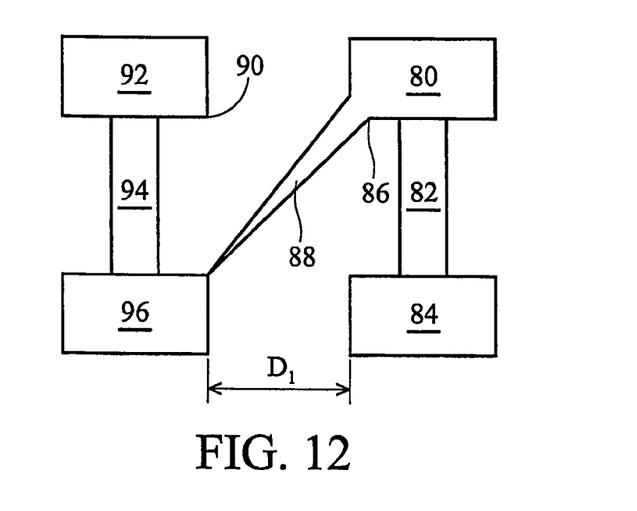
FIG. 12 illustrates an application of the preferred embodiment of the present invention, where two via structures are in the same metal layers.

FIG. 12 illustrates another application of the preferred embodiment. A first via structure comprises a via 82 and copper lines 80 and 84. A second via structure comprises a via 94 and copper lines 92 and 96. Both via structures are located in the same layers. An extrusion 88 may be formed at corner 86 of the copper line 80, causing time dependent dielectric breakdown. When the horizontal distance $D_1$ is smaller than about 0.15 µm, a substantially round bottom corner 86 having a round profile defined in Equations 1 through 3 is preferred.

In a conventional integrated circuit, there may be eight or nine metal layers, or levels. Metal level one (M1) is typically the lowest and its metal feature size is typically smallest. Conductive features in metal levels two through nine typically have greater dimensions and are spaced further. However, with the scaling of the integrated circuit, the dimensions of metal levels two through nine decreases so that time dependent dielectric breakdown is likely to occur. Therefore, substantially round bottom corners are desired for conductive features in metal level 2 (M2) and higher levels when the horizontal distance between conductive features is smaller than 0.15 µm and/or the vertical distance is greater than about 0.3 µm.

The preferred embodiment of the present invention can be used to form substantially round bottom corners for conductive features by using an etch stop layer and by changing etching chemistry. With round bottom corners having a higher radius of curvature, the electrical field is less concentrated and the stress to the surrounding dielectrics is reduced.

Although the present invention and its advantages have been described in detail, it should be understood that various changes, substitutions and alterations can be made herein without departing from the spirit and scope of the invention as defined by the appended claims. Moreover, the scope of the present application is riot intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a via interconnection structure, the method comprising:
   forming a first inter-level dielectric (ILD) over a substrate;
   forming a first trench in the first ILD;

filling the first trench with conductive material to form a first conductive line;
forming a via etch stop layer (ESL) over the first ILD and the first conductive line;
forming a via ILD on the via ESL;
forming a trench ESL on the via ILD;
forming a trench ILD on the trench ESL;
etching a via opening through the trench ILD, trench ESL, via ILD and stopping at the via ESL;
etching a second trench through the trench ILD and stopping at the trench ESL;
etching the trench ESL to form a substantially round bottom corner of the second trench;
etching the exposed via ESL;
wherein the second trench has at least one bottom round corner with a substantially rounded portion having a horizontal width greater than about one fifth the total width of the second trench and a height greater than about one fourth the total height of the second trench; and
filling the via and the second trench with conductive material.

2. The method of claim 1 further comprising the steps of:
forming a first ESL between the substrate and the first ILD; and
etching the first ESL to form round bottom corners for the first trench.

3. The method of claim 1 wherein the first trench is etched by an etching chemistry comprising $CF_4$, $CHF_3$, Ar, and $O_2$, and wherein the etching chemistry comprises oxygen content of between about 1% and about 10%, carbon content of between about 1% and about 10%, and hydrogen content of between about 1% and about 10%.

4. The method of claim 3 wherein the etching chemistry comprises about 5% oxygen content, about 5% carbon content, and about 5% hydrogen content.

5. The method of claim 1 wherein the second trench is etched by an etching chemistry comprising $CF_4$, $CHF_3$, Ar, and $O_2$, and wherein the etching chemistry comprises oxygen content of between about 1% and about 10%, carbon content of between about 1% and about 10%, and hydrogen content of between about 1% and about 10%.

6. The method of claim 5 wherein the etching chemistry comprises about 5% oxygen content, about 5% carbon content, and about 5% hydrogen content.

7. A method for forming an integrated circuit structure, the method comprising:
forming a first conductive feature and a second conductive feature over a substrate, wherein the second conductive feature is in a close proximity of the first conductive feature;
wherein the second conductive feature has at least one bottom round corner facing directly the first conductive feature, wherein the bottom round corner has a substantially rounded portion having a horizontal width greater than about one fifth the total width of the second conductive feature and a height greater than about one fourth the total height of the second conductive feature;
wherein the second conductive feature is formed by forming a trench and filling the trench with a conductive material; and
wherein the trench is etched by an etching chemistry comprising $CF_4$, $CHF_3$, Ar, and $O_2$ and wherein the etching chemistry comprises oxygen content of between about 1% and about 10%, carbon content of between about 1% and about 10%, and hydrogen content of between about 1% and about 10%.

8. The method of claim 7 further comprising the step of forming an etch stop layer (ESL) between the second conductive feature and the substrate.

9. The method of claim 7 wherein the first and second conductive features are on a same conductive level and wherein the first and second conductive features have a spacing of less than about 0.15 μm.

10. The method of claim 7 wherein the first conductive feature further comprises a third conductive feature underlying and connecting to the first conductive feature.

11. The method of claim 7 wherein the first conductive feature is at a level lower than the second conductive feature and wherein the first and second features have a vertical spacing of less than about 0.3 μm.

12. The method of claim 7 wherein the first and second conductive features are at metal level 2 or overlying levels.

* * * * *